(12) United States Patent
Bal et al.

(10) Patent No.: US 11,909,410 B2
(45) Date of Patent: *Feb. 20, 2024

(54) SIGMA-DELTA ANALOG-TO-DIGITAL CONVERTER CIRCUIT WITH REAL TIME CORRECTION FOR DIGITAL-TO-ANALOG CONVERTER MISMATCH ERROR

(71) Applicant: STMicroelectronics International N.V., Geneva (CH)

(72) Inventors: Ankur Bal, Greater Noida (IN); Sharad Gupta, New Delhi (IN)

(73) Assignee: STMicroelectronics International N.V., Geneva (CH)

( * ) Notice: Subject to any disclaimer, the term of this patent is extended or adjusted under 35 U.S.C. 154(b) by 0 days.

This patent is subject to a terminal disclaimer.

(21) Appl. No.: 17/982,242

(22) Filed: Nov. 7, 2022

(65) Prior Publication Data
US 2023/0054364 A1    Feb. 23, 2023

Related U.S. Application Data

(63) Continuation of application No. 17/306,178, filed on May 3, 2021, now Pat. No. 11,522,553.

(Continued)

(51) Int. Cl.
*H03M 1/06* (2006.01)
*H03M 1/08* (2006.01)
*H03M 1/10* (2006.01)

(52) U.S. Cl.
CPC ........ *H03M 1/0809* (2013.01); *H03M 1/0626* (2013.01); *H03M 1/0648* (2013.01); *H03M 1/1014* (2013.01)

(58) Field of Classification Search
CPC ........ H03M 1/66; H03M 1/747; H03M 3/464; H03M 3/502; H03M 1/74; H03M 1/1009;
(Continued)

(56) References Cited

U.S. PATENT DOCUMENTS 5,825,253 A    10/1998  Mathe et al.
6,271,781 B1 *  8/2001  Pellon ............... H03M 3/388
                                                   341/143
(Continued)

OTHER PUBLICATIONS

J. G. Kauffman, P. Witte, J. Becker, and M. Ortmanns, "An 8.5 mW continuous-time ΔΣ modulator with 25 MHz bandwidth using digital background dac linearization to achieve 63.5 dB SNDR and 81 dB SFDR", IEEE Journal of Solid-State Circuits, vol. 46, No. 12, pp. 2869-2881, 2011.

(Continued)

*Primary Examiner* — Linh V Nguyen
(74) *Attorney, Agent, or Firm* — Crowe & Dunlevy (57) ABSTRACT

An estimate of unit current element mismatch error in a digital to analog converter circuit is obtained through a correlation process. Unit current elements of the digital to analog converter circuit are actuated by bits of a thermometer coded signal generated in response to a quantization output signal. A correlation circuit generates the estimates of the unit current element mismatch error from a correlation of a first signal derived from the thermometer coded signal and a second signal derived from the quantization output signal.

20 Claims, 3 Drawing Sheets

Related U.S. Application Data (60) Provisional application No. 63/020,256, filed on May 5, 2020.

(58) Field of Classification Search
CPC .... H03M 1/066; H03M 1/742; H03M 1/0673; H03M 1/1038; H03M 1/68; H03M 1/00; H03M 1/1057; H03M 1/0665; H03M 1/745; H03M 3/338; H03M 1/0668; H03M 1/1033; H03M 1/1071; H03M 3/30; H03M 1/46; H03M 1/687; H03M 1/70; H03M 1/0682; H03M 3/50
USPC .................. 341/118–121, 143, 144, 155
See application file for complete search history.

(56) References Cited

U.S. PATENT DOCUMENTS

| | | | |
|---|---|---|---|
| 6,271,782 B1 | 8/2001 | Steensgaard-Madsen | |
| 6,304,608 B1 | 10/2001 | Chen et al. | |
| 6,308,874 B1* | 10/2001 | Kim | B60R 9/042 |
| | | | 224/310 |
| 6,356,129 B1 | 3/2002 | O'Brien et al. | |
| 6,359,575 B1* | 3/2002 | Knudsen | H03M 1/02 |
| | | | 341/120 |
| 6,380,874 B1 | 4/2002 | Knudsen | |
| 6,606,004 B2 | 8/2003 | Staszewski et al. | |
| 6,611,221 B1* | 8/2003 | Soundarapandian | |
| | | | H03M 1/0665 |
| | | | 375/252 |
| 6,661,362 B2 | 12/2003 | Brooks | |
| 6,727,832 B1 | 4/2004 | Melanson | |
| 7,030,792 B2 | 4/2006 | Chen | |
| 7,053,808 B2 | 5/2006 | Chen | |
| 7,176,822 B2* | 2/2007 | Schimper | H03M 1/0665 |
| | | | 341/120 |
| 7,271,666 B1 | 9/2007 | Melanson | |
| 7,522,690 B2 | 4/2009 | Zhang | |
| 7,626,529 B2* | 12/2009 | Robert | H03M 1/162 |
| | | | 341/120 |
| 7,994,957 B2 | 8/2011 | O'Donnell et al. | |
| 8,542,138 B2 | 9/2013 | Galton et al. | |
| 9,203,426 B2* | 12/2015 | Zhao | H03M 3/388 |
| 9,219,495 B2 | 12/2015 | Si | |
| 9,438,266 B1 | 9/2016 | Nagaraj et al. | |
| 9,543,974 B1 | 1/2017 | Yang | |
| 9,634,687 B2 | 4/2017 | Huang et al. | |
| 9,716,509 B2 | 7/2017 | Zhao | |
| 9,871,534 B2* | 1/2018 | Tsai | H03M 3/424 |
| 10,965,302 B1 | 3/2021 | Zhao et al. | |
| 11,139,826 B2 | 10/2021 | Li | |
| 11,522,553 B2* | 12/2022 | Bal | H03M 3/424 |
| 2006/0056561 A1 | 3/2006 | Zhang | |
| 2007/0109164 A1* | 5/2007 | Arias | H03M 3/388 |
| | | | 341/143 |
| 2007/0236377 A1* | 10/2007 | Chen | H03M 3/368 |
| | | | 341/144 |
| 2008/0025383 A1 | 1/2008 | Li | |
| 2009/0085785 A1 | 4/2009 | Gerfers et al. | |
| 2010/0073207 A1* | 3/2010 | Gupta | H03M 3/388 |
| | | | 341/120 |
| 2012/0075132 A1* | 3/2012 | Lai | H03M 3/38 |
| | | | 341/143 |
| 2012/0194369 A1 | 8/2012 | Galton et al. | |
| 2016/0006448 A1 | 1/2016 | Melanson et al. | |
| 2019/0173479 A1 | 6/2019 | Dyachenko et al. | |

OTHER PUBLICATIONS

Breems et al., "A 2.2GHz continuous-time ΔΣ ADC with—102dBc THD and 25MHz BW", IEEE Journal of Solid-State Circuits, vol. 51, No. 12, Dec. 2016.

M. Runge and F. Gerfers, "A digital compensation method canceling static and non-linear time-variant feedback DAC errors in ΔΣ analog-to-digital converters," in 2017 IEEE International Symposium on Circuits and Systems (ISCAS).

Marcel Runge, and Friedel Gerfers, "Correlation Based Time-Variant DAC Error Estimation in Continuous-Time ΣΔ ADCs with Pseudo Random Noise" in 2018 IEEE International Symposium on Circuits and Systems (ISCAS).

P. Witte and M. Ortmanns, "Background DAC error estimation using a pseudo random noise based correlation technique for sigma-delta analog-to-digital converters," IEEE Transactions on Circuits and Systems I: Regular Papers, vol. 57, No. 7, pp. 1500-1512, 2010.

T. Cataltepe, A. R. Kramer, L. E. Larson, G. C. Temes, and R. H. Walden, "Digitally corrected multi-bit sigma delta data converters", in IEEE International Symposium on Circuits and Systems, May 8-11, 1989, pp. 647-650.

J.K. Moon, J. Silva, J. Steensgaard, and G. C. Temes, "Switched capacitor DAC with analogue mismatch correction," Electronics Letters, vol. 35, No. 22, p. 1903, 1999.

X. Wang, U. Moon, M. Liu and G. C. Temes, "Digital Correlation Technique for The Estimation and Correction of DAC Errors in Multibit ΣΔMASH ADC" in 2002 IEEE International Symposium on Circuits and Systems.

* cited by examiner

FIG. 5

SIGMA-DELTA ANALOG-TO-DIGITAL CONVERTER CIRCUIT WITH REAL TIME CORRECTION FOR DIGITAL-TO-ANALOG CONVERTER MISMATCH ERROR

CROSS-REFERENCE TO RELATED APPLICATION

This application is a continuation of U.S. application Ser. No. 17/306,178, filed May 3, 2021, which claims priority from U.S. Provisional Application Patent No. 63/020,256 filed May 5, 2020, the disclosures of which are incorporated by reference.

TECHNICAL FIELD

Embodiments generally relate to an analog-to-digital converter circuit and, in particular, to a sigma-delta analog-to-digital converter circuit.

BACKGROUND

Figure 1:
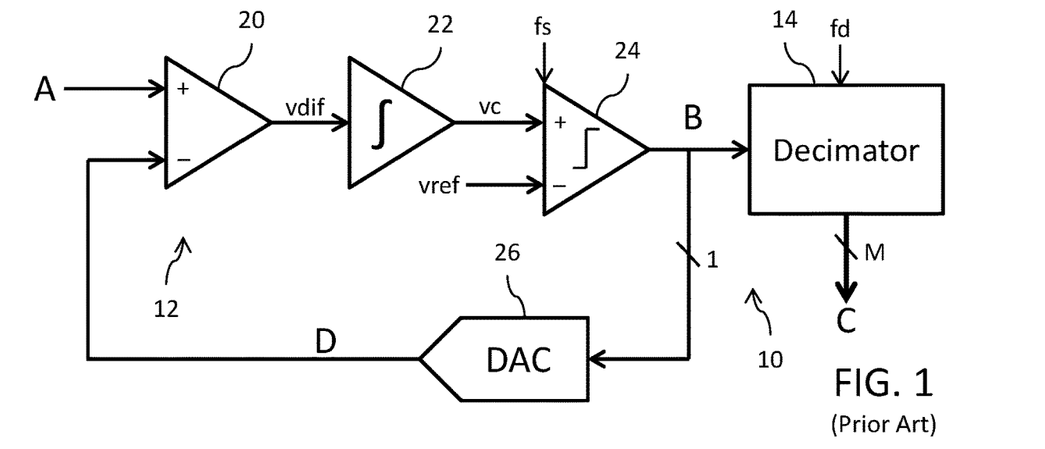
FIG. 1 is a block diagram of a conventional sigma-delta analog-to-digital converter circuit with single bit quantization.

FIG. 1 shows a time domain block diagram of a conventional sigma-delta analog-to-digital converter circuit 10. The circuit 10 includes a first order sigma-delta modulator circuit 12 having an input configured to receive an analog input signal A and an output configured to generate a digital output signal B comprised of a pulse density modulated pulse stream of 1-bit codes. The ratio formed by a count of the number of pulses in the pulse stream of the signal B divided by a total number of samples (set by a sampling rate fs) of the input signal A over a known time interval represents the instantaneous magnitude of the input signal A. The circuit 10 further includes a decimator circuit 14 that accumulates and averages the pulses in the pulse stream of the digital output signal B to generate a digital signal C comprised of a stream of multi-bit (M-bit, where M>>1) digital words at a data rate set by a decimation rate fd, where fd<<fs (referred to in the art as oversampling).

The first order sigma-delta modulator circuit 12 comprises a difference amplifier 20 (or summation circuit) having a first (non-inverting) input that receives the analog input signal A and a second (inverting) input that receives an analog feedback signal D. The difference amplifier 20 outputs an analog difference signal vdif in response to a difference between the analog input signal A and the analog feedback signal D (i.e., vdif(t)=A(t)−D(t)). The analog difference signal vdif is integrated by an integrator circuit 22 to generate a change signal vc having a slope and magnitude that is dependent on the sign and magnitude of the analog difference signal vdif. A voltage comparator circuit 24 samples the change signal vc at the sampling rate fs and compares each sample of the change signal vc to a reference signal vref to generate a corresponding the single bit pulse of the digital output signal B (where the single bit has a first logic state if vc≥vref and has a second logic state if vc<vref). The voltage comparator circuit 24 effectively operates as a single bit quantization circuit. A single bit digital-to-analog converter (DAC) circuit 26 then converts the logic state of the digital output signal B to a corresponding analog voltage level for the analog feedback signal D.

Figure 2:
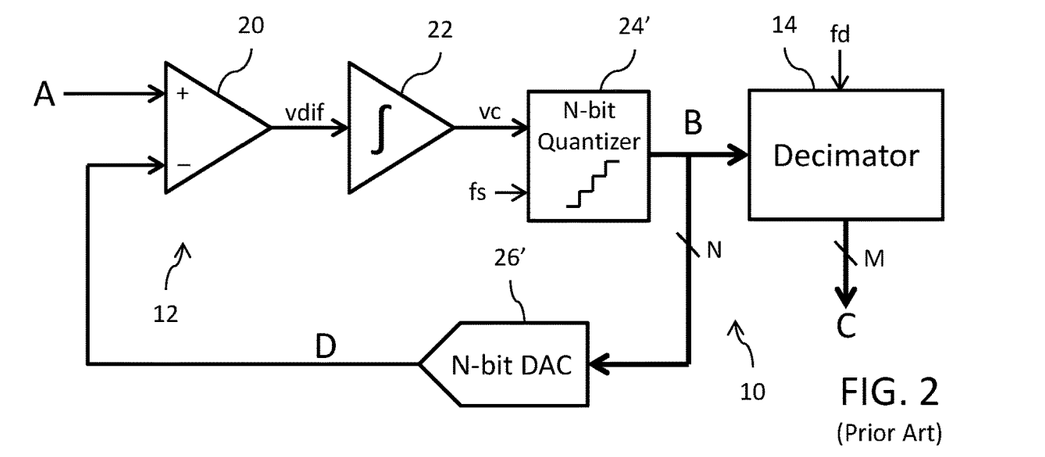
FIG. 2 is a block diagram of a conventional sigma-delta analog-to-digital converter circuit with multi-bit quantization.

It is possible to instead implement the sigma-delta modulator circuit 12 with a multi-bit quantization (for example, N bits, where 1<N<<M) as shown by FIG. 2. This circuit implementation requires an N-bit quantization circuit 24' and an N-bit DAC circuit 26' in the feedback loop. The quantization circuit 24' samples the change signal vc at the sampling rate fs and generates for each sample a corresponding N-bit code word for the digital output signal B. The DAC circuit 26' converts the N-bit code word of the digital output signal B to a corresponding analog voltage level for the analog feedback signal D. The decimator circuit 14 accumulates and averages the N-bit code words in the stream of the digital output signal B to generate a digital signal C comprised of the stream of multi-bit (M-bit, where M>>N) digital words at a data rate set by a decimation rate fd. In an example, N=3 to 5 bits and M=12 to 16 bits. The use of multi-bit quantization presents a number of advantages including: permitting operation of the modulator to achieve a given resolution using a lower sampling rate fs; or permitting operation of the modulator to achieve a higher resolution for a given sampling rate fs.

A key characteristic of the sigma-delta modulator circuit 12 is its ability to push the quantization noise due to operation of the quantization circuit 24, 24' to higher frequencies away from the signal of interest. This is known in the art as noise shaping. The decimator circuit 14 can then be implemented with a low-pass filtering characteristic to substantially remove the high frequency components of the shaped quantization noise.

The output (digital signal B, also referred to herein as v(k)) of the sigma-delta analog-to-digital converter circuit using an ideal DAC circuit 26' is given by the following equation:

$$v(k)=u(k)stf(k)+q(k)\cdot ntf(k)$$

where: k is time, u(k) is the input signal A, q(k) is the quantization error introduced by the quantization circuit 24', stf(k) is impulse response of the signal transfer function of the system and ntf(k) is the impulse response of the noise transfer function of the system.

The logical structure of the DAC circuit 26' can be viewed as N unit current sources where each unit current element $I_u$ of the DAC circuit 26' is controlled by one bit of a selecting signal $b_i(k)$ that is generated in response to the digital output signal B. So, for the DAC circuit 26' to have N+1 output levels, N unit current sources are needed. Each unit current element $I_u$ is controlled by one of the bits $b_i(k)$, where i=1, 2, . . . , N designates the particular unit current element being controlled.

Each unit current source is configured to output a current having a same nominal value. In reality, however, the same nominal value for the current generated by the unit current sources of the DAC circuit 26' cannot be achieved. The multibit DAC circuit 26' is inherently non-linear (as compared to the single bit DAC circuit 26 of FIG. 1) because of static element mismatch arising from process, voltage and temperature variation. In such a non-ideal multibit DAC circuit 26', an error $e_i$ is introduced by the $i^{th}$ unit current element $I_u$ to the ideal $b_i(k)$ value. The effect of this error manifests as a part of the ADC output v(k) for digital signal B as follows:

$$v(k)=u(k)stf(k)+q(k)ntf(k)+\Sigma_{i=1}^{N}e_i\cdot b_i(k)\cdot etf(k)$$

where: the term $\Sigma_{i=1}^{N}e_i\cdot b_i(k)\cdot etf(k)$ (k) is introduced due to DAC static element mismatch and can be referred to herein as the DAC error, and etf(k) is the impulse response of the error transfer function. The static element mismatch of the multibit DAC circuit 26' along with the integral non-linearity results in spurs appearing at output, and this will seriously degrade the performance of the sigma-delta analog-to-digital converter circuit.

In the case where the N-bit code word for the digital output signal B is thermometer coded, the static element mismatch across the thermometric unit current elements $I_u$ controlled by the thermometer coded selecting signal $b_i(k)$ is the primary concern. For a thermometer coded signal, it is noted that there is a fixed pattern on the selection of unit current elements $I_u$ for the N possible codes. The selecting signals $b_i(k)$ are strongly correlated to the DAC input and as the signal $b_i(k)$ is a scaled version of the ADC output signal $v(k)$ it will contain a component of the input signal. As a result, input signal-dependent tones will appear at the ADC output. To solve this issue, a decorrelation of the thermometer coded selecting signals $b_i(k)$ at the DAC input is necessary.

Figure 3:
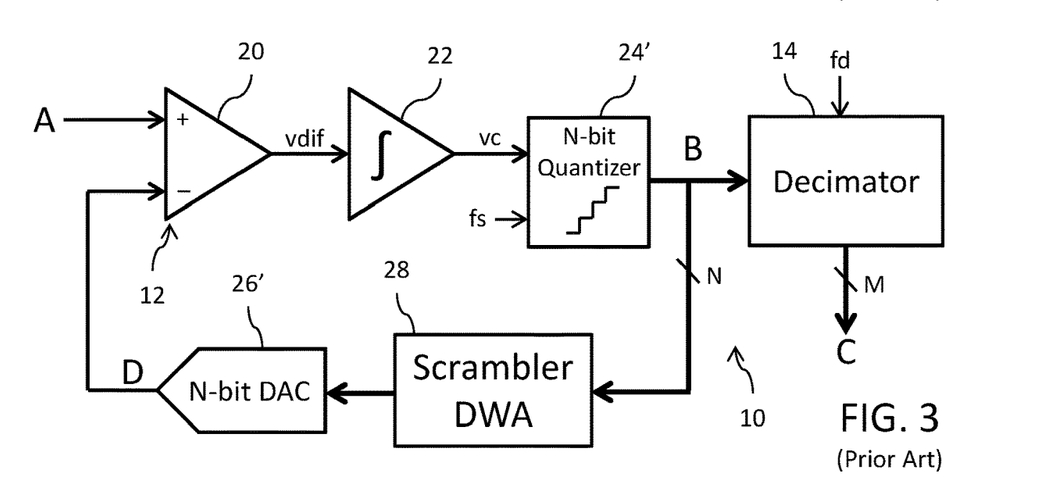
FIG. 3 is a block diagram of a conventional sigma-delta analog-to-digital converter circuit with multi-bit quantization and scrambling of DAC codes.

A solution for providing this decorrelation of the thermometer coded selecting signals $b_i(k)$ is shown in FIG. 3. The thermometer coded selecting signals $b_i(k)$ generated in response to the ADC output signal $v(k)$ are randomly scrambled by a scrambler data weighted averaging (DWA) circuit 28. The scrambler DWA circuit 28 reorders the N bits in the thermometer code of the selecting signal $b_i(k)$ in a random manner without altering the absolute value of those bits (for example, thermometer coded bits <1, 1, 1, 1, 0, 0, 0, 0> can be randomly reordered to <1, 0, 0, 1, 0, 0, 1, 1> with no change in the absolute value of 4). Because of this, the selection of unit current elements $I_u$ at each time k in the multibit DAC circuit 26' becomes dynamic or random. This zero-order randomization is a dynamic element matching DEM technique achieved through a digital rearranging process implemented by the scrambler DWA circuit 28. The selecting signals $b_i(k)$ are now decorrelated with the DAC input signal 30, eliminating the input signal dependent tones at the DAC output.

The output of the ideal DAC is the sum of the outputs of the unit current elements $I_u$:

$$a_{ideal}(k) = \Delta \Sigma_{i=1}^{N} b_i(k)$$

wherein: $\Delta$ equals the quantization step.

In practice, the current sources used in the DAC are not ideal in nature resulting in deviations from their ideal value. Assume $e_i$ (i=1, 2, ..., N) are the values of normalized deviations of the unit elements outputs from their mean value (referred to as unit element errors). Thus, the output of each unit element can be represented as $\Delta(1+e_i)$. The output of a non-ideal (actual) DAC is then:

$$a_{actual}(k) = \Delta \Sigma_{i=1}^{N} b_i(k) + \Delta \Sigma_{i=1}^{N} b_i(k) e_i$$

The second term of the foregoing equation is the error introduced in the DAC and is referred as DAC error (or mismatch error). This DAC error is basically the selecting signals $b_i(k)$ multiplied by the corresponding normalized deviations $e_i$ over N signals:

$$\text{DAC error} = \Delta \Sigma_{i=1}^{N} b_i(k) \cdot e_i$$

The DAC error appears in the output equation of the sigma-delta analog-to-digital converter circuit after passing through the signal transfer function (STF(z)) of the ADC with a phase shift of 180°. Thus, the error transfer function (ETF(z)) for the DAC can be defined in the slowest feedback path as follows:

$$ETF(z) = -STF(z)$$

So, the DAC error at the output of the ADC is given by:

$$\Sigma_{i=1}^{N} b_i(k) \cdot e_i \cdot etf(k)$$

It will be noted here that the $\Delta$ of the equation is canceled by the $\Delta$ of the quantizer before appearing at the ADC output.

As a result of the non-linearity introduced in the analog output of the DAC by the DAC error, a distorted modulator output is produced. The non-linearity also modulates the quantization noise of the quantization circuit 24' into the signal band resulting in a degraded signal-to-noise ratio (SNR).

In order to take advantage of the benefits of multi-bit quantization in sigma-delta modulator circuits, it is necessary to estimate the inherent non-linearity (i.e., DAC error) present in the operation of the multi-bit DAC circuit and apply a correction to nullify its effects.

SUMMARY

For sigma-delta analog to digital converters (ADCs) that utilize a feedback digital to analog converter (DAC) for conversion, the final analog output of the DAC can be affected or distorted by non-linearity error in the DAC due to DAC element mismatch. A digital process performs an estimation to determine the DAC element mismatch error. Digital codes at the quantizer output are convolved with a loop error transfer function and the subsequent ADC outputs are filtered and correlated with a modified form of the convolved digital codes to estimate the DAC element mismatch error.

In an embodiment, a circuit for estimating unit current element mismatch error in a digital to analog converter circuit, where unit current elements of the digital to analog converter circuit are actuated by bits of a thermometer coded signal generated in response to a quantization output signal, comprises: a correlation circuit configured to generate estimates of the unit current element mismatch error from a correlation of a first signal derived from the thermometer coded signal and a second signal derived from the quantization output signal.

In an embodiment, a system comprises: a quantization circuit configured to generate a quantization output signal; a digital to analog converter (DAC) circuit including unit current elements that are actuated by bits of a thermometer coded signal generated in response to the quantization output signal; and an error estimation circuit configured to estimate unit current element mismatch error in the digital to analog converter circuit. The error estimation circuit comprises: a correlation circuit configured to generate the estimates of the unit current element mismatch error from a correlation of a first signal derived from the thermometer coded signal and a second signal derived from the quantization output signal.

In an embodiment, a sigma-delta modulator comprises: a differencing circuit having a first input configured to receive an input signal and a second input configured to receive a feedback signal and an output configured to generate a difference signal; a loop filter circuit configured to filter the difference signal and generate a change signal; a quantization circuit configured to sample the change signal at a sampling frequency rate, quantize the sampled change signal and generate a stream of code words; a digital-to-analog converter (DAC) circuit configured to generate the feedback signal by converting a thermometer coded signal generated in response to the stream of code words, wherein the DAC circuit has a non-ideal operation due to mismatch error; a replica DAC circuit that provides a digital replication of the DAC circuit, said digital replication comprising estimated error programming which accounts for the non-ideal operation of the DAC circuit due to mismatch error; and an error estimation circuit configured to generate the estimated error programming from a correlation of the thermometer coded signal and the stream of code words.

In an embodiment, a method comprises: generating a thermometer coded signal in response to a quantization output signal; wherein bits of the thermometer coded signal control actuation of unit current elements within a digital to analog converter circuit; correlating a first signal derived from the thermometer coded signal and a second signal derived from the quantization output signal to generate estimates of unit current element mismatch error.

In an embodiment, a method comprises: generating a quantization output signal; generating a thermometer coded signal in response to the quantization output signal; actuating unit current elements of a digital to analog converter (DAC) circuit in response to bits of the thermometer coded signal; and estimating unit current element mismatch error in the digital to analog converter circuit by: correlating a first signal derived from the thermometer coded signal and a second signal derived from the quantization output signal.

BRIEF DESCRIPTION OF THE DRAWINGS

For a better understanding of the embodiments, reference will now be made by way of example only to the accompanying figures in which.

DETAILED DESCRIPTION

Figure 4:
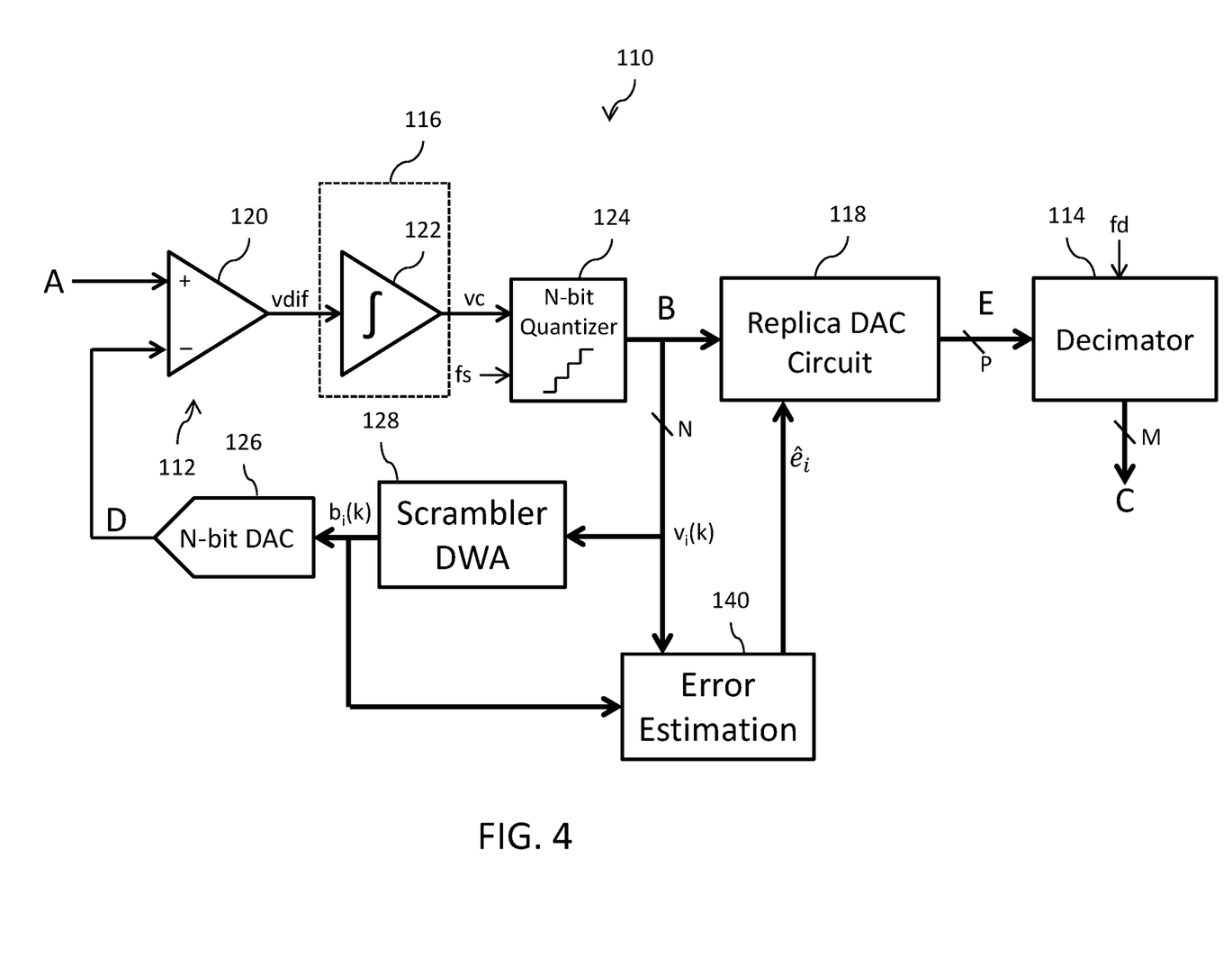
FIG. 4 is a block diagram of a sigma-delta analog-to-digital converter circuit with multi-bit quantization and feedback digital-to-analog converter mismatch correction.

Reference is now made to FIG. 4 which shows a block diagram of a sigma-delta analog-to-digital converter circuit 110 with multi-bit quantization and feedback digital-to-analog converter (DAC) mismatch correction. The circuit 110 includes an N-bit sigma-delta modulator circuit 112 having an input configured to receive an analog input signal A and an output configured to generate a digital output signal B comprised of a stream of N-bit code words. The sigma-delta modulator circuit 112 comprises a difference amplifier 120 (i.e., summation circuit) having a first (non-inverting) input that receives the analog input signal A and a second (inverting) input that receives an analog feedback signal D. The difference amplifier 20 outputs an analog difference signal vdif in response to a difference between the analog input signal A and the analog feedback signal D (where vdif(t)=A(t)−D(t)). The analog difference signal vdif is integrated by a K-order loop filter 116 (using, for example, K integrator circuits 122) to generate a change signal vc having a slope and magnitude that is dependent on the sign and magnitude of the analog difference signal vdif. An N-bit quantization circuit 124 samples the change signal vc at the sampling rate fs and generates for each sample a corresponding N-bit code word of the digital output signal B (also referred to as the ADC output v(k)). This signal is thermometer coded with the bits of the code word scrambled by a data weighted averaging (DWA) scrambler circuit 128 to generate a selecting signal $b_i(k)$. An N-bit digital-to-analog converter (DAC) circuit 126 in the feedback loop converts the bits of the scrambled thermometer coded selecting signal $b_i(k)$ to generate a corresponding voltage level for the analog feedback signal D.

The sigma-delta modulator circuit 112 implements a loop filter 116 with a K-order integration circuit implementation. In the illustration of FIG. 1, K=1 as there is only one integration shown (with integrator 122) in the loop filter 116, but it will be understood that this is by way of example only, and K may equal 2, 3 or more as needed by the desired noise shaping and circuit application. Those skilled in the art know how to implement a K>1 order loop filter 116 for the sigma-delta modulator circuit 112.

The stream of N-bit code words for the digital output signal B produced by the N-bit quantization circuit 124 are input to the scrambling circuit 128 to be passed through, after scrambling, to the N-bit DAC circuit 126 in the feedback path. This stream of N-bit code words for the digital output signal B is further input to a replica DAC circuit 118. In this context, the replica DAC circuit 118 is programmed by an error estimation circuit 140 to digitally model the operation of the feedback N-bit DAC circuit 126. In other words, to digitally model the ideal DAC operation plus the DAC error introduced by the non-linear operation of the unit elements. In response to this programming, the replica DAC circuit 118 processes the ADC output v(k) to remove the DAC error.

The replica DAC circuit 118 provides a digital replication of the analog N-bit DAC circuit 126, that replication specifically accounting for the non-ideal operation of the N-bit DAC circuit 126 due to element mismatch. More specifically, the replica DAC circuit 118 is programmed with a plurality of digital code words that are directly proportional to the value of the mismatched unit elements of the analog N-bit DAC circuit 126. In other words, digital codes corresponding to the analog value of the unit element error $e_i$. The digital code words can be of any selected precision P, and are determined by the error estimation circuit 140. It will be appreciated that if the digital model provided by the replica DAC circuit 118 is substantially identical to the non-ideal actual operation of the analog N-bit DAC circuit 126, then the digital signal E output from the digital DAC copy circuit 118 will be functionally equivalent to the analog feedback signal D output from the analog N-bit DAC circuit 126. In this context, "functionally equivalent" means that an analog conversion of the digital value for the digital signal E generated in response to signal B by the digital DAC copy circuit 118 is substantially equal to the corresponding analog value for the analog feedback signal D generated in response to that same signal B. The digital signal E output by the digital DAC copy circuit 118 comprises a stream of P-bit code words (where P>N, the higher resolution provided by P bits being necessary to provide fractional components necessary to account for effects of the mismatch error). The difference in bits (P−N) defines the degree of substantial equality that is achievable.

The operation of the replica DAC circuit 118 may be better understood through the use of an example. Assume that the scrambled thermometer coded selecting signal $b_i(k)$ would activate two unit current elements. If the analog N-bit DAC circuit 126 had an ideal functional operation, the analog voltage for the analog feedback signal D output from the analog N-bit DAC circuit 126 would have a value of $2*\Delta$. However, due to mismatch error, the voltage of the generated analog feedback signal D output from the analog N-bit DAC circuit 126 instead has a value of $2*\Delta+e_1\Delta+e_2\Delta$. The error estimation circuit 140 operates to process the scrambled thermometer coded selecting signal $b_i(k)$ and the ADC output $v(k)$ to estimate the error $e_i$ for each of the unit current elements. The replica DAC circuit 118 is programmed with the estimation of the error $e_i$. So, with consideration to the forgoing example, the digital signal E output from the replica DAC circuit 118 will be a code word with a precision of P-bits formed by summing the N-bit digital code for 2*$\Delta$ (i.e., the ideal response) plus the digital code for $\Delta$ times the sum of the programmed digital code words for the unit element errors $e_1$ and $e_2$ (i.e., $\Delta(e_1+e_2)$) which is the introduced mismatch error.

The circuit 110 further includes a decimator circuit 114 that accumulates and averages the P-bit code words in the stream of the digital output signal E to generate a digital signal C comprised of a stream of multi-bit (M-bit) digital words at a data rate set by a decimation rate fd, where fd<<fs and 1<N<P<<M. The decimator circuit 114 implements a low pass filtering to effectively remove the high-passed signal components of the quantization error and mismatch error.

As previously noted, the ADC output $v(k)$ of the sigma-delta analog-to-digital converter circuit consists of:
1) the filtered input signal $u'(k)$ which is equal to $u(k) \cdot stf(k)$, where $stf(k)$ is impulse response of the signal transfer function (STF(z)) of the system;
2) the filtered quantization noise $q'(k)$ which is equal to $q(k) \cdot ntf(k)$, where $ntf(k)$ is the impulse response of the noise transfer function (NTF(z)) of the system; and
3) the filtered DAC error $\Sigma_{i=1}^{N} b'_i(k) \cdot e_i$, where $b'_i(k) = b_i(k) \cdot etf(k)$ and $etf(k)$ is the impulse response of the error transfer function (ETF(z)) of the system.

The ADC output $v(k)$ is thus given by the equation:

$$v(k) = u'(k) + q'(k) + \Sigma_{i=1}^{N} b'_i(k) \cdot e_i$$

The error estimation circuit 140 receives the scrambled thermometer code word $b_i(k)$ output from the data weighted averaging (DWA) scrambler circuit 128 and the digital output signal B ($v_i(k)$) produced by the N-bit quantization circuit 124. These signals are processed to estimate the unit element errors (the estimated errors referred to herein as $\hat{e}_i$). The replica DAC circuit 118 is then programmed with these estimated errors $\hat{e}_i$, and a DAC error correction term:

$$\text{DAC err corr} = \Sigma_{i=1}^{N} b'_i(k) \cdot \hat{e}_i$$

is eliminated from the ADC output $v(k)$ by the replica DAC circuit 118 to substantially cancel the DAC error $\Sigma_{i=1}^{N} b'_i(k) \cdot e_i$ and obtain a corrected ADC output $v_c(k)$:

$$v_c(k) = u'(k) + q'(k)$$

The corrected ADC output $v_c(k)$ is then processed through the decimator 114 at the decimation rate fd to generate the digital output signal C.

Figure 5:
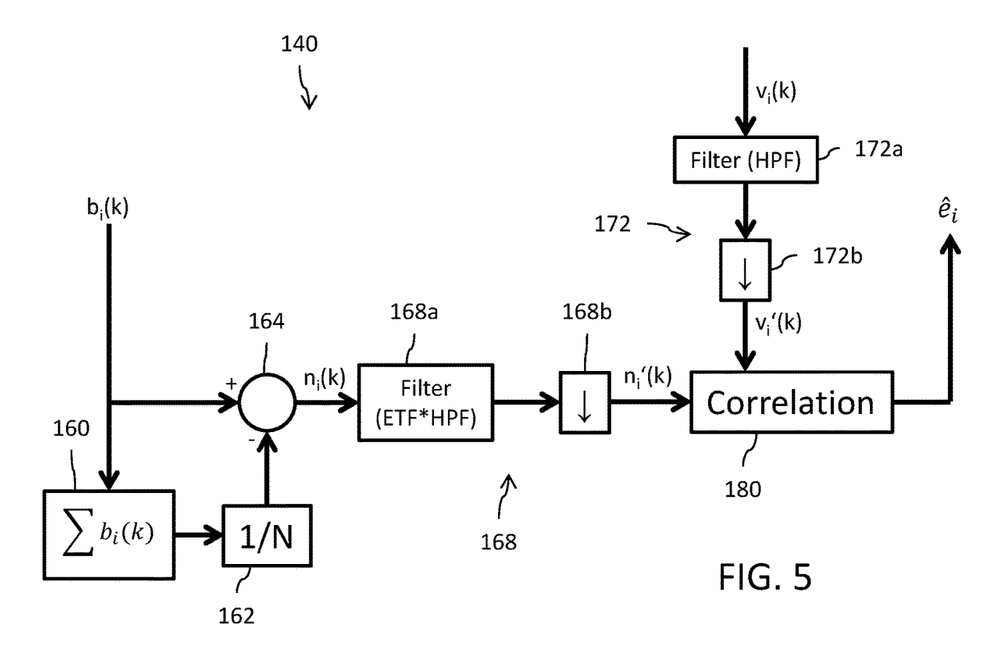
FIG. 5 is a block diagram for an error estimation circuit.

Reference is now made to FIG. 5 which shows a block diagram for the error estimation circuit 140. In order to identify and formulate a measure that remains constant and is independent of the input thermometer code from the selecting signals, the term $n_i(k)$ is defined as:

$$n_i(k) = b_i(k) - \frac{1}{N}\sum_{i=1}^{N} b_i(k)$$

A summation circuit 160 receives the scrambled thermometer code word $b_i(k)$ and calculates the $\Sigma_{i=1}^{N} b_i(k)$ component and a divider circuit 162 applies the 1/N fraction. The output of the divider circuit 162 is applied to one input of a subtraction circuit 164. Another input of the subtraction circuit 164 receives the scrambled thermometer code word $b_i(k)$ signal and performs the subtraction operation to generate the term $n_i(k)$.

It can be shown that for all values of $b_i(k)$, the sum of $n_i(k)$ is zero:

$$\Sigma_{i=1}^{N} n_i(k) = 0$$

A determination is now made as to whether the generated term $n_i(k)$ has any impact on the actual DAC output and the corresponding ADC output. With reference again to the non-ideal DAC output of:

$$a_{actual}(k) = \Delta \Sigma_{i=1}^{N} b_i(k) + \Delta \Sigma_{i=1}^{N} b_i(k) \cdot e_i$$

and, since $\Sigma_{i=1}^{N} e_i = 0$ for a given DAC, then:

$$a_{actual}(k) = \Delta \Sigma_{i=1}^{N} b_i(k) + \Delta \Sigma_{i=1}^{N} n_i(k) \cdot e_i$$

As a result, the DAC error can be represented as:

$$\text{DAC error} = \Delta \Sigma_{i=1}^{N} n_i(k) \cdot e_i$$

Substituting for the term $n_i(k)$, the ADC output can be re-written as:

$$v(k) = u'(k) + q'(k) + \Sigma_{i=1}^{N} n'_i(k) \cdot e_i$$

where: $u'(k)$ is the input signal A passed through the modulator STF(z) and $q'(k)$ is the shaped quantization error. A first signal conditioning circuit 168 receives the signal $n_i(k)$ and applies a filtering 168a and a decimation 168b to generate the signal $n'_i(k)$. Filtering is needed to remove the STF passed input signal $u'(k)$ from the modulator output. This is done to de-correlate $v(k)$ with the input signal $u(k)$ because any signal component present in the output will interfere with the correlation operation. In this context, $n'_i(k)$ is the STF passed version of $n_i(k)$. Recall that $n_i(k)$ is injected into the loop (via feedback) at the summation node at the input. So, $n_i(k)$ and $u(k)$ both pass through an identical STF and are labeled as $n'_i(k)$ and $u'(k)$, respectively. The filtering 168a has a transfer function that is a combination of error transfer function (ETF(z)) and a high pass filtering. As a result, the overall signal conditioning operation is therefore one of a polyphase decimation filtering.

Since the scrambled thermometer code word $b_i(k)$ signal and the input signal $u'(k)$ can be assumed to be decorrelated, the correlation between $v(k)$ and $n'_i(k)$ can be computed to obtain an estimate of the errors. The correlation may be mathematically expressed as:

$$CORR[v(k), n'_i(k)] = CORR[u'(k), n'_i(k)] + CORR[q'(k), n'_i(k)] + CORR\{[\Sigma_{j=1}^{N} e_j \cdot n'_j(k)], n'_i(k)\}$$

For every i there are N number of j's where N is the number of DAC elements. Intuitively, the above-expression means that N bit streams (STF passed $n'_i(k)$) emerging from feedback DAC input (because DAC has N inputs) when correlated with the modulator output (which is a summation of applied codes to DAC+DAC error represented by $[\Sigma_{j=1}^{N} e_j \cdot n'_j(k)]$) provides N outputs that are proportional to the DAC element error). To elaborate further, 'i' is the digital part of the equation, where 'i' data lines exist as unique physical entities. 'j' is the index to represent DAC passed, STF passed, quantizer passed mashed/summed data, where 'j' individually is no longer discernable.

The first two terms of the foregoing equation evaluate to zero under the following assumed conditions:
  a) $e_i$ terms follow a normal distribution and are relatively constant over a period;
  b) the input signal $u(k)$ is filtered out from the ADC output; and
  c) the quantization error $q'(k)$ is white, uniformly distributed and uncorrelated to $n'_i(k)$.

With these assumptions in place, the correlation may be simplified and mathematically expressed as:

$$CORR[v'(k),n'_i(k)] = e_i + \{\Sigma_{j=1, j \neq i}^{N} e_j(k) \cdot CORR[n'_j(k), n'_i(k)]\}$$

where: v'(k) is the ADC output filtered so that it does not contain the input signal. The error estimation circuit 140 accordingly includes a second signal conditioning circuit 172 that receives the signal v(k) as output from the quantizer and applies a high pass filtering (HPF, reference 172a) and a decimation 172b function to produce the signal v'(k). The overall signal conditioning operation is therefore one of a polyphase decimation high pass filtering.

It will be noted at this point that the signal $b_i(k)$ branches out of the scrambler 128 into the following two paths:
a) for v'$_i$(k): the path comprises a DAC, the STF, and the quantizer followed by a polyphase decimation high pass filter (using the second signal conditioning circuit 172); and
b) for n'$_i$(k): the path comprises a digital approximation of the STF and a polyphase decimation high pass filtering (using the first signal conditioning circuit 168).

A correlation circuit 180 performs the correlation CORR[v'(k),n'$_i$(k)]. This correlation operation produces a matrix of size N×1 as follows:

$$\begin{bmatrix} CORR\,[v'(k),\, n'_1(k)] \\ CORR\,[v'(k),\, n'_2(k)] \\ \vdots \\ CORR\,[v'(k),\, n'_N(k)] \end{bmatrix} = R \cdot \begin{bmatrix} e_1 \\ e_2 \\ \vdots \\ e_N \end{bmatrix}$$

where:

$$R = \begin{bmatrix} 1 & \cdots & CORR\,[n'_N(k),\, n'_1(k)] \\ CORR\,[n'_1(k),\, n'_2(k)] & \cdots & CORR\,[n'_N(k),\, n'_2(k)] \\ \vdots & \ddots & \vdots \\ CORR\,[n'_1(k),\, n'_N(k)] & \cdots & 1 \end{bmatrix}$$

is an N×N Matrix.

The estimated error terms $\hat{e}_i$, can be computed as follows:

$$\begin{bmatrix} \hat{e}_1 \\ \hat{e}_2 \\ \vdots \\ \hat{e}_N \end{bmatrix} = R^{-1} \cdot \begin{bmatrix} CORR\,[v'(k),\, n'_1(k)] \\ CORR\,[v'(k),\, n'_2(k)] \\ \vdots \\ CORR\,[v'(k),\, n'_N(k)] \end{bmatrix}$$

The R matrix consists of a correlation of n'$_j$(k) and n'$_i$(k) which can be computed easily. The estimated errors $\hat{e}_i$, can then be calculated as:

$$\hat{e}_i = \frac{N-1}{N} \cdot CORR\,[v'(k),\, n'_i(k)]$$

Once $\hat{e}_i$ is estimated, the replica DAC at ADC output is populated with these estimated error values. The correction block to remove the DAC error in the replica DAC is a low rate multiply and add operation which can easily be accommodated in the subsequent digital filter chain. Because the estimation and computation operations run at a much lower rate than the modulator itself, there is a significant savings in power consumption. This solution is attractive for use in wide-band, high-speed, high performance sigma-delta modulators.

While the invention has been illustrated and described in detail in the drawings and foregoing description, such illustration and description are considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

What is claimed is:

1. A method, comprising:
   generating a thermometer coded signal in response to a quantization output signal;
   wherein bits of the thermometer coded signal control actuation of unit current elements within a digital to analog converter circuit;
   generating a first matrix from correlations between bits in a first signal derived from the thermometer coded signal and corresponding bits in a second signal derived from the quantization output signal;
   generating a second matrix from correlations between all of the bits in the first signal; and
   multiplying the first matrix by the second matrix to generate a third matrix containing estimates of unit current element mismatch error.

2. The method of claim 1, further comprising:
   randomly scrambling the bits of the thermometer coded signal; and
   applying the randomly scrambled bits of the thermometer coded signal to control actuation of unit current elements within the digital to analog converter circuit.

3. The method of claim 1, further comprising:
   generating from the bits of the thermometer coded signal a third signal having a bit summation measure that is constant and independent of a thermometer code word of the thermometer coded signal;
   filtering the third signal to generate a first filtered signal as said first signal; and
   filtering the quantization output signal to generate a second filtered signal as said second signal.

4. The method of claim 3, wherein filtering the third signal high pass filtering.

5. The method of claim 3, wherein filtering the quantization output signal comprises a combination of high pass filtering and error transfer filtering.

6. The method of claim 3, wherein filtering the quantization output signal comprises high pass filtering.

7. The method of claim 3, wherein generating the third signal comprises:
   summing bits of the thermometer coded signal;
   dividing the summed bits of the thermometer coded signal by a number of the bits in the thermometer coded signal to produce an output signal; and
   subtracting the output signal from the bits of the thermometer coded signal to generate the third signal.

8. The method of claim 1, further comprising processing the quantization output signal in response to the generated estimates of unit current element mismatch error to generate a digital signal.

9. The method of claim 8, further comprising decimating the digital signal to generate an output signal.

10. A method, comprising:
generating a quantization output signal;
generating a thermometer coded signal in response to the quantization output signal;
actuating unit current elements of a digital to analog converter (DAC) circuit in response to bits of the thermometer coded signal; and
estimating unit current element mismatch error in the digital to analog converter circuit by:
performing a first correlation between bits of a first signal derived from the thermometer coded signal and corresponding bits of a second signal derived from the quantization output signal;
performing a second correlation between all bits of the second signal; and
multiplying a result of the first correlation by a result of the second correlation to generate estimates of unit current element mismatch error.

11. The method of claim 10, further comprising:
applying a correction for unit current element mismatch error in response to the estimated unit current element mismatch error.

12. The method of claim 11, further comprising:
filtering a difference signal derived from an analog signal output from the digital to analog converter circuit; and
quantizing a signal generating from said filtering to generate said quantization output signal.

13. The method of claim 10, further comprising scrambling bits of the thermometer coded signal for input to the digital to analog converter.

14. The method of claim 10, further comprising:
generating from the bits of the thermometer coded signal a signal having a bit summation measure that is constant and independent of a thermometer code word of the thermometer coded signal;
filtering the signal to generate a first filtered signal as said first signal; and
filtering the quantization output signal to generate a second filtered signal as said second signal.

15. The method of claim 14, wherein filtering the signal comprises high pass filtering.

16. The method of claim 14, wherein the filtering the quantization output signal comprises a combination of high pass filtering and error transfer filtering.

17. The method of claim 14, wherein the filtering the quantization output signal comprises high pass filtering.

18. The method of claim 14, wherein generating comprises:
summing bits of the thermometer coded signal;
dividing the summed bits of the thermometer coded signal by a number of the bits in the thermometer coded signal to produce an output signal; and
subtracting the output signal from the bits of the thermometer coded signal to generate the signal.

19. The method of claim 10, further comprising processing the quantization output signal in response to the generated estimates of unit current element mismatch error to generate a digital signal.

20. The method of claim 19, further comprising decimating the digital signal to generate an output signal.

* * * * *